United States Patent
Lee

(10) Patent No.: US 7,416,912 B2
(45) Date of Patent: Aug. 26, 2008

(54) METHOD OF FABRICATING CMOS IMAGE SENSOR

(75) Inventor: Sang Gi Lee, Buncheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 51 days.

(21) Appl. No.: 11/322,848

(22) Filed: Dec. 30, 2005

(65) Prior Publication Data

US 2007/0082423 A1    Apr. 12, 2007

(30) Foreign Application Priority Data

Sep. 21, 2005    (KR) .................... 10-2005-0087600

(51) Int. Cl.
*H01L 21/00*    (2006.01)
(52) U.S. Cl. .................... 438/57; 438/65; 438/66; 438/70
(58) Field of Classification Search ............ 438/48, 438/738, 56–57, 700–701, 731, 740, 51, 438/55, 64–68, 83, 98
See application file for complete search history.

(56) References Cited

U.S. PATENT DOCUMENTS

| | | | |
|---|---|---|---|
| 5,838,054 A * | 11/1998 | Kwasnick et al. ........... 257/457 |
| 6,342,428 B1 * | 1/2002 | Zheng et al. ................ 438/424 |
| 6,861,686 B2 * | 3/2005 | Lee et al. ..................... 257/291 |
| 6,905,800 B1 * | 6/2005 | Yuen et al. ...................... 430/5 |
| 7,193,289 B2 * | 3/2007 | Adkisson et al. ............ 257/431 |
| 2005/0012166 A1 * | 1/2005 | Choi ........................... 257/414 |
| 2005/0074938 A1 * | 4/2005 | Han ............................ 438/258 |
| 2005/0142834 A1 * | 6/2005 | Lee ............................. 438/601 |
| 2005/0260827 A1 * | 11/2005 | Cheng et al. ................ 438/435 |
| 2005/0280007 A1 * | 12/2005 | Hsu et al. ...................... 257/79 |
| 2006/0017127 A1 * | 1/2006 | Vigier-Blanc ............... 257/432 |
| 2006/0124948 A1 * | 6/2006 | Lee .............................. 257/98 |
| 2006/0183265 A1 * | 8/2006 | Oh et al. ....................... 438/65 |

* cited by examiner

*Primary Examiner*—Walter L. Lindsay, Jr.
*Assistant Examiner*—Grant S Withers
(74) *Attorney, Agent, or Firm*—Andrew D. Fortney

(57) ABSTRACT

A method of fabricating a CMOS image sensor is disclosed, by which image sensor characteristics are enhanced. In one aspect, the method includes forming a plurality of photodiodes in the photodiode region of a semiconductor substrate; stacking a first insulating layer over the semiconductor substrate including the photodiodes; forming a metal pad on the insulating layer in the pad region of the substrate; forming a second insulating layer over the semiconductor substrate including the metal pad; selectively etching exposed portions of the second insulating layer, using a mask, to form simultaneously a pad opening in the pad region and a trench in the photodiode region; selectively etching portions of the second insulating layer and the first insulating layer under the trench; and forming a slope on lateral sides of at least the second insulating layer.

20 Claims, 7 Drawing Sheets

US 7,416,912 B2

METHOD OF FABRICATING CMOS IMAGE SENSOR

This application claims the benefit of Korean Patent Application No. 10-2005-0087600, filed on Sep. 21, 2005, which is hereby incorporated by reference as if fully set forth herein.

BACKGROUND OF THE INVENTION

1. Field of the Invention

The present invention relates to an image sensor, and more particularly, to a method of fabricating a CMOS image sensor. Although the present invention is suitable for a wide scope of applications, it is particularly suitable for enhancing image sensor characteristics.

2. Discussion of the Related Art

An image sensor is a semiconductor device that converts an optical image into an electrical signal. A complementary MOS (CMOS) image sensor includes a photosensing device, such as a photodiode, and a CMOS logic circuit including a plurality of MOS transistors corresponding to the number of pixels. The CMOS image sensor is generally fabricated using CMOS technology. To enhance photosensitivity of the image sensor, its fill factor may be improved, but since the logic circuit (or other peripheral structures) consumes some area, there are limits to improving the fill factor. Alternatively, microlenses may be used to direct incident light onto the photosensing areas only. Another approach to photosensitivity enhancement is to shorten the traveling distance of a light signal passing through a microlens layer to be transmitted to an underlying photodiode.

To provide an image sensor with color separation capability, a color filter array including a plurality of color filters is arranged, together with the microlenses, over the respective photosensing devices. The color filter array and microlenses are disposed in a photodiode region, separate from and adjacent to a pad region for forming a plurality of wiring layer interconnections of the CMOS logic circuit, which may be configured for a three-transistor (3T) or for a four-transistor (4T) CMOS image sensor. A 3T CMOS image sensor consists of one photodiode and three transistors per pixel, and a 4T CMOS image sensor consists of one photodiode and four transistors per pixel.

Referring to FIG. 1, a unit pixel of a general 3T-type CMOS image sensor consists of one photodiode PD and three NMOS transistors Rx, Dx, and Sx. The cathode of the photodiode PD is connected to the drain of the first NMOS transistor Rx and the gate of the second NMOS transistor Dx. The sources of the first and second NMOS transistors Rx and Dx are connected to a power line supplying a reference voltage $V_R$, and a gate of the first NMOS transistor Rx is connected to a reset line supplying a reset signal. The source of the third NMOS transistor Sx is connected to the drain of the second NMOS transistor Dx. The drain of the third NMOS transistor Sx is connected to a read circuit (not shown). The gate of the third NMOS transistor Sx is connected to a row select line supplying a select signal, which generally enables reading and/or sensing a signal generated by the photodiode and at least the second NMOS transistor Dx.

Referring to FIG. 2, an active region 10 is defined in a unit pixel of the general 3T-type CMOS image sensor. A photodiode 20 is formed on a relatively large and/or wide portion of the active region 10, and other parts of the active region are overlapped by three gate electrodes 120, 130, and 140, to configure a reset transistor Rx, a drive transistor Dx, and a select transistor Sx, respectively. The exposed portions of the active region 10 of each transistor are doped with impurity ions to become corresponding source/drain regions. A power voltage Vdd is applied to the source/drain regions between the reset and drive transistors Rx and Dx. A plurality of signal lines (not shown) are respectively connected to the gate electrodes and connect the source/drain region of the select transistor Sx a read circuit (not shown). A pad is provided to each of the signal lines to connect to an external drive circuit.

FIGS. 3A-3D respectively illustrate sequential process steps of a method of fabricating a contemporary CMOS image sensor.

Referring to FIG. 3A, a semiconductor substrate (not shown) is divided into a photodiode region and a pad region, and a plurality of photodiodes 20 for generating charges according to intensity of incident light are formed in the photodiode region. A first insulating interlayer 100 is formed over the substrate including the photodiodes 20. A tetra-ethyl-ortho-silicate oxide layer 101 is formed on the first insulating interlayer 100. A metal pad 102 for each signal line is formed on the oxide layer 101. In doing so, the metal pad 102, which generally comprises aluminum, may be formed from the same metal layer as the gate electrodes 120, 130, and 140 (see FIG. 2) using the same material. A second insulating interlayer 103 is formed over the substrate including the metal pad 102.

Referring to FIG. 3B, the second insulating interlayer 103 is coated with a first layer of photoresist, which is patterned by exposure and development steps to form a photoresist pattern 104 for exposing a portion of the second insulating interlayer 103 over the metal pad 102. The exposed portion of the second insulating interlayer 103 is selectively etched using the first photoresist pattern 104 as an etch mask to form a pad opening 105 on the metal pad 102.

Referring to FIG. 3C, the first photoresist pattern 104 is removed. The semiconductor substrate including the pad opening 105 is coated with a second layer of photoresist, which is selectively patterned by exposure and development to form a second photoresist pattern 106 for exposing the photodiode region. The second insulating interlayer 103 and the oxide layer 101 are selectively etched in the photodiode region, using the second photoresist pattern 106 as a mask. This etching is to reduce a distance between the photodiodes 20 and a microlens to be formed later.

Referring to FIG. 3D, the second photoresist pattern 106 is removed. A plurality of hemispherical microlenses 107 are formed on the first insulating interlayer 100 in the photodiode area, each microlens 107 corresponding to a unique photodiode 20, by coating the substrate with a microlens material layer, patterning the microlens material layer, and reflowing the patterned microlens material.

Since the microlens and a color filter layer are formed after completion of the pad opening, a vertical slope may be formed on an edge of the photodiode region. Hence, striation occurs, which may degrade the uniformity of the microlens thickness. Moreover, photolithography and etching processes, for reducing the distance between the microlens and the photodiode, are separately and/or additionally carried out, thereby increasing the number of process steps.

SUMMARY OF THE INVENTION

Accordingly, the present invention is directed to a method of fabricating a CMOS image sensor that substantially obviates one or more problems due to limitations and disadvantages of the related art.

An object of the present invention is to provide a method of fabricating a CMOS image sensor, in which a photodiode region and a pad region may have different etching thicknesses, using a pad opening mask for both regions, and by which optical efficiency of the photodiode region may be enhanced.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages in accordance with the purpose of the invention, as embodied and broadly described herein, there is provided a method of fabricating a CMOS image sensor, which may comprise forming, in a semiconductor substrate divided into a photodiode region and a pad region, a plurality of photodiodes in the photodiode region; forming an insulating layer over the semiconductor substrate including the photodiodes; forming a metal pad on the insulating layer in the pad region; forming a second insulating layer over the semiconductor substrate including the metal pad; forming a mask layer on the second insulating interlayer, to expose portions of the second insulating interlayer over the metal pad and the photodiodes; selectively etching the exposed portions of the second insulating interlayer to form simultaneously a pad opening in the pad region and a trench in the photodiode region; selectively etching portions of the second insulating interlayer and the insulating layer under the trench; and forming a slope on lateral sides of the second insulating layer and the insulating layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

FIGS. 4A-4G respectively illustrate sequential process steps of a method of fabricating a CMOS image sensor according to the present invention.

Figure 1:
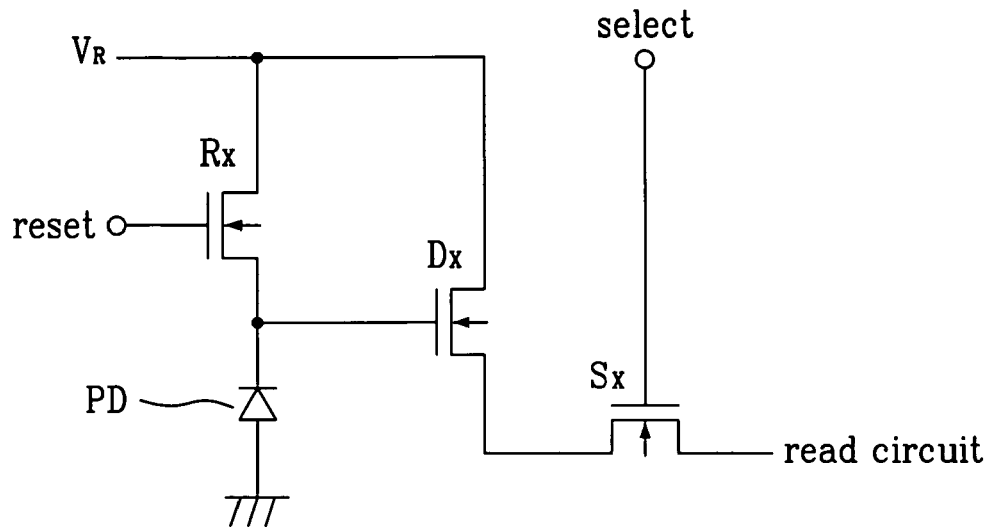
FIG. 1 is a circuit diagram of a unit pixel in a general 3T-type CMOS image sensor.
Figure 2:
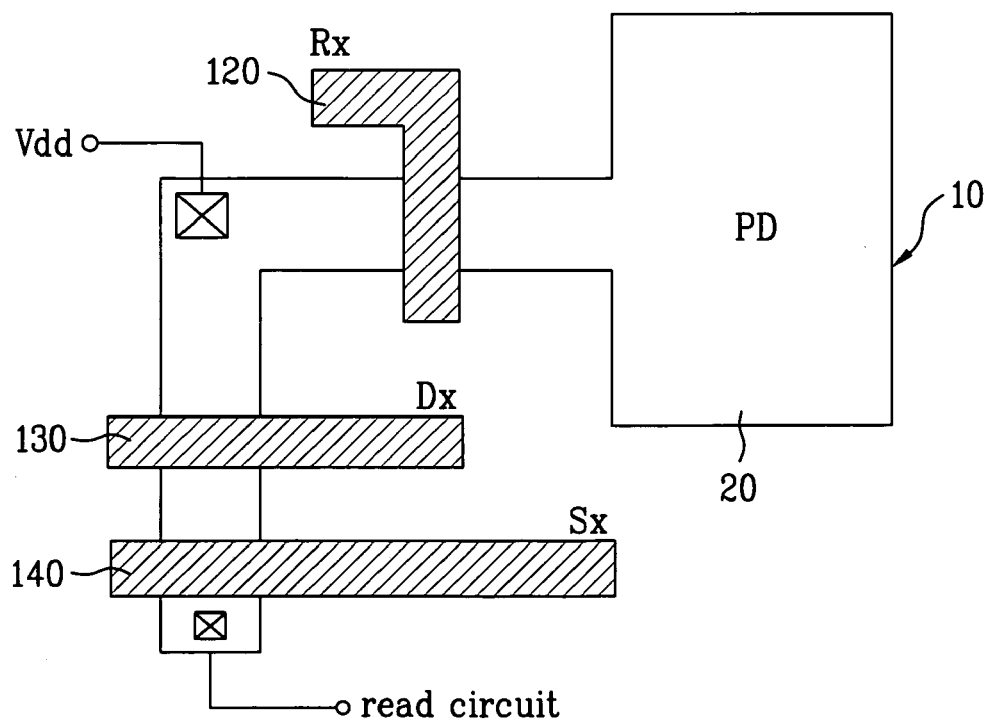
FIG. 2 is a layout diagram of the unit pixel of FIG. 1.
Figure 3A:
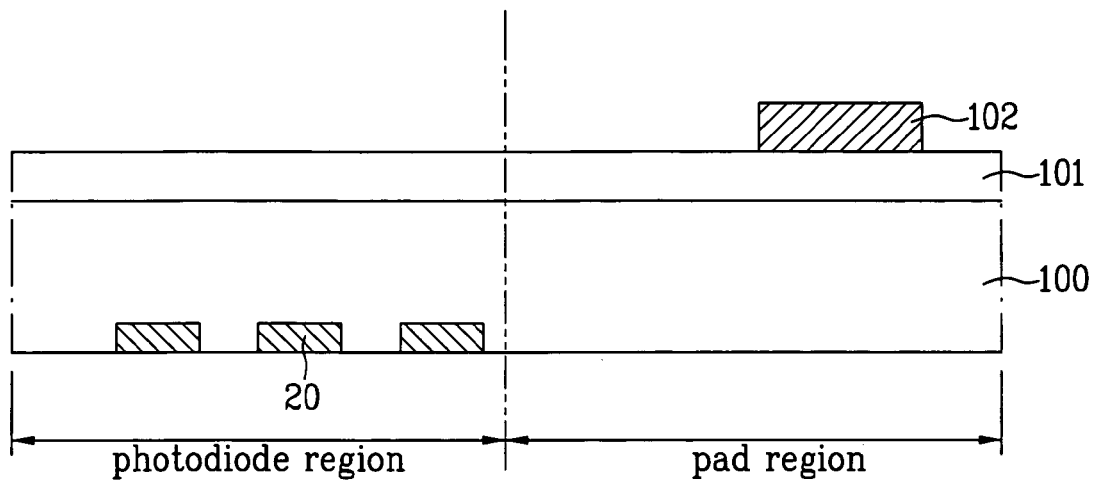
FIGS. 3A-3D are cross-sectional views of a contemporary CMOS image sensor.
Figure 3B:
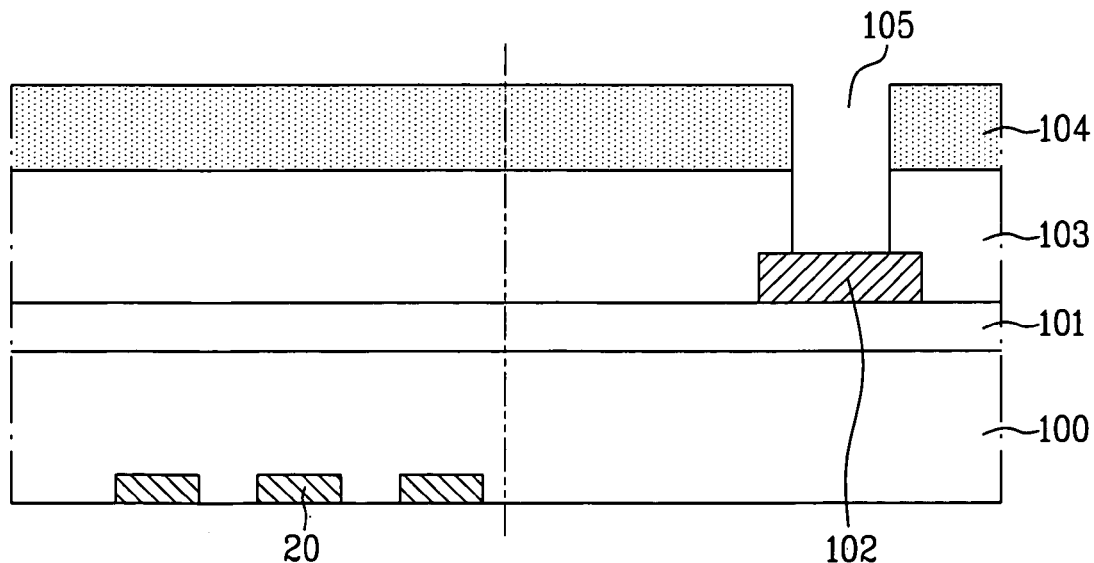
Figure 3C:
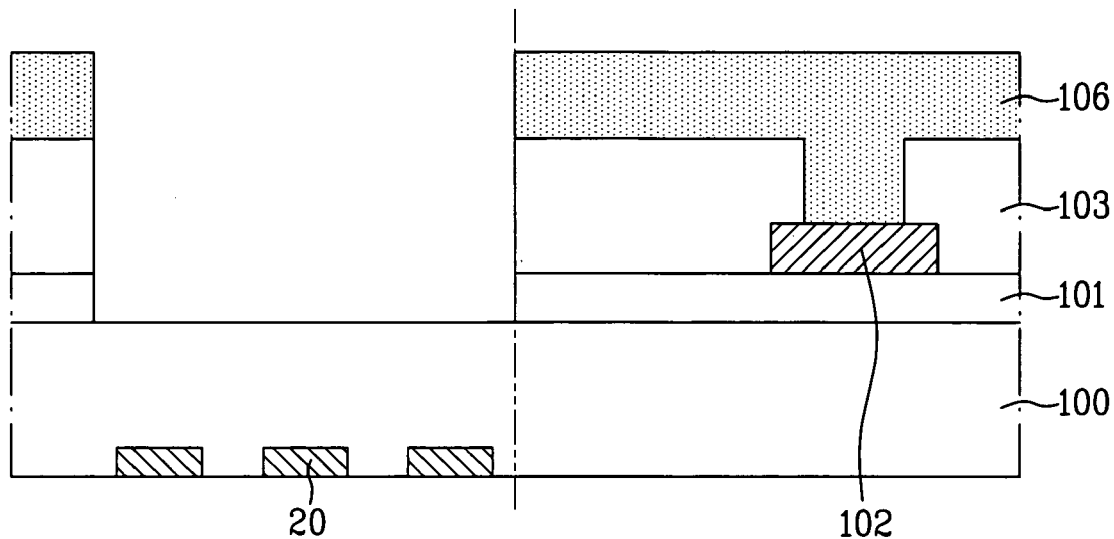
Figure 3D:
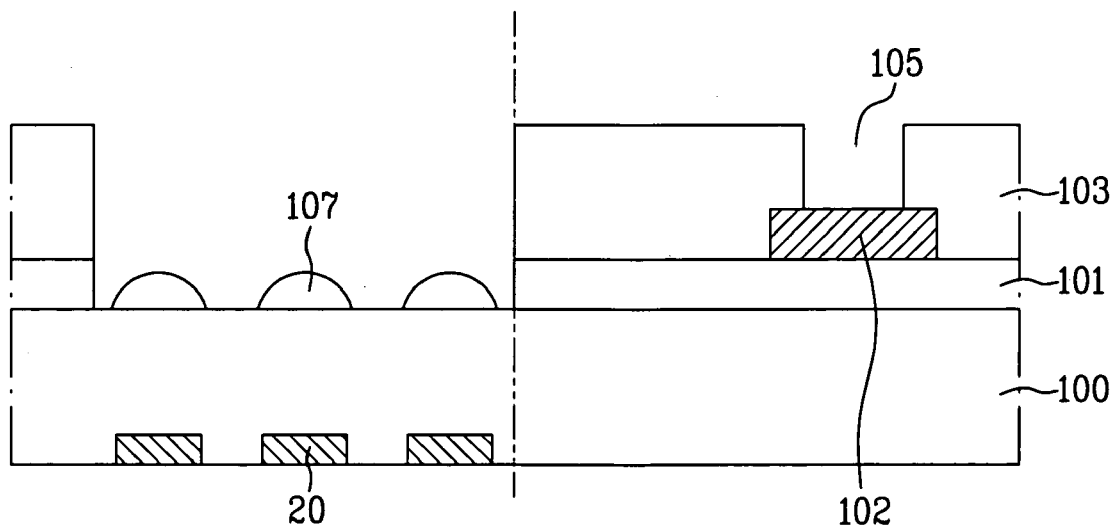
Figure 4A:
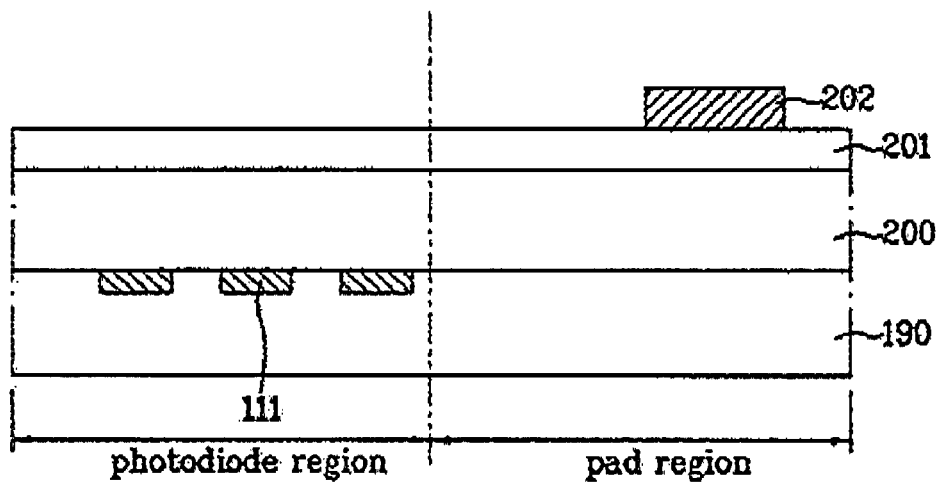
FIGS. 4A-4G are cross-sectional views of a CMOS image sensor according to the present invention.

Referring to FIG. 4A, a semiconductor substrate 190 is divided into a photodiode region and a pad region and may include first and second epitaxial layers. A plurality of photodiodes 111, for sensing red, green, and blue light (or, alternatively, yellow, cyan and magenta light) to generate electrical charges and/or signals according to the intensity of the incident light, are formed in the photodiode region. The respective photodiodes (i.e., for each color) may have a predetermined depth determined by corresponding conditions of the ion implantation into the semiconductor substrate. Here, the red photodiode has the greatest depth from the substrate surface, and the green and blue photodiodes are successively formed in the first and second epitaxial layers, respectively, whereby the depth of the green photodiode is determined with respect to the surface of the first epitaxial layer and the depth of the blue photodiode is determined with respect to the surface of the second epitaxial layer formed on the first epitaxial layer. Alternatively, the respective photodiodes may be formed adjacent to each other (a so-called "horizontal image sensor") in a single-crystal silicon wafer or an epitaxial silicon layer grown thereon. A first insulating interlayer 200, which may comprise a multi-layer structure (not shown), is farmed over the substrate including the photodiodes 111 to a thickness of about 1,000 Å. The multi-layer structure may include a light shielding layer, formed between first and second insulating layers, to block the transmission of light directed toward lower areas other than a specific one of the photodiodes 111. The first insulating layer formation may include low-pressure chemical vapor deposition of a tetraethyl-ortho-silicate oxide, and the second insulating layer may comprise a borophosphorus silicate glass layer formed by chemical vapor deposition. Then, via-hole formation and metal wiring processes are carried out to connect the photodiodes, through the first insulating interlayer 200, to various circuit elements (not shown). An insulator (e.g., a tetra-ethyl-ortho-silicate oxide) layer 201 is formed on the formed on the first insulating interlayer 200, and a metal pad 202, providing a connection for a signal line (not shown), is formed on the insulator layer 201. The metal pad 202, which generally comprises aluminum to improve its resistance to corrosion, may comprise the same material (i.e., as part of the same patterned metal layer) as the gate electrodes 120, 130, and 140 (see FIG. 2). In forming a metal pad comprising aluminum, the surface of the metal pad 202 may be treated using ultraviolet light-generated ozone or a similar, synthesized compound. A titanium nitride (TiN) layer is also typically formed on the metal pad 202. A second insulating layer 203 is formed over the substrate including the metal pad 202. In one embodiment, the second insulating layer 203 comprises an oxide layer 203-1 and a nitride layer 203-2. whereby the oxide layer is deposited on the substrate including the metal pad 202, then planarized by chemical-mechanical polishing, and the nitride layer is formed on the planarized oxide layer by conventional blanket deposition (e.g., CVD).

Figure 4B:
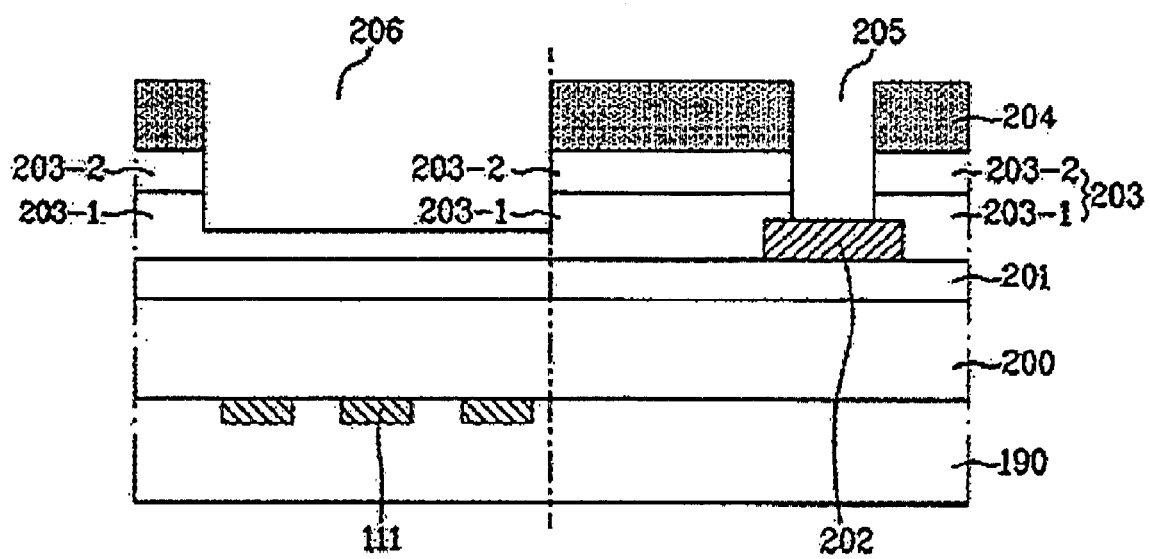

Referring to FIG. 4B, the second insulating interlayer 203 is coated with photoresist, which is patterned by exposure and development steps to form a photoresist pattern 204 for exposing portions of the second insulating layer over the metal pad 202 and the photodiodes 111, respectively. Using the photoresist pattern 204 as an etching mask, the exposed portions of the second insulating layer 203 are selectively etched to form a pad opening 205 exposing a surface of the metal pad 202 and to form a trench 206 having a corresponding or predetermined depth in the photodiode region.

Figure 4C:
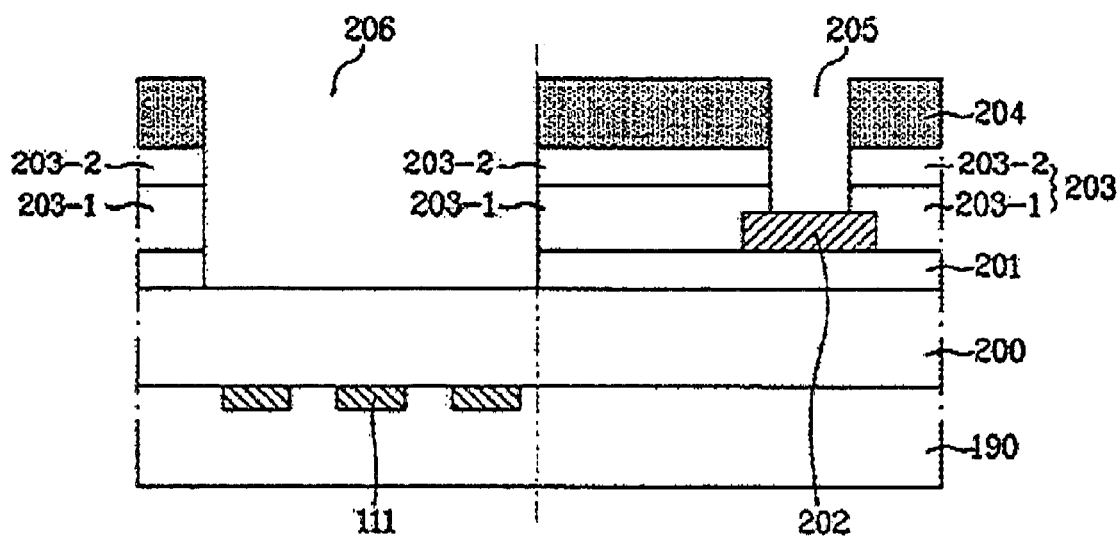

Referring to FIG. 4C, using at least a portion of the photoresist pattern 204 again as a mask, the trench 206 is deepened by selectively etching the remainder of the second insulating layer 203 and the entire thickness of the oxide layer 201. The etchant and etching conditions include those providing an etch selectivity ratio of the oxide layer 201 to the metal pad 202 (and, preferably, of the second insulating layer 203 remainder to the metal pad 202), e.g., of at least 5:1, 10:1, 20:1, 50:1, or any minimum value of 5:1 or more. The etching of the insulator layers over the photodiode region may be facilitated by varying (e.g., increasing) the thickness of the metal pad 202 as needed or desired, according to the above etch selectivity ratio.

Figure 4D:
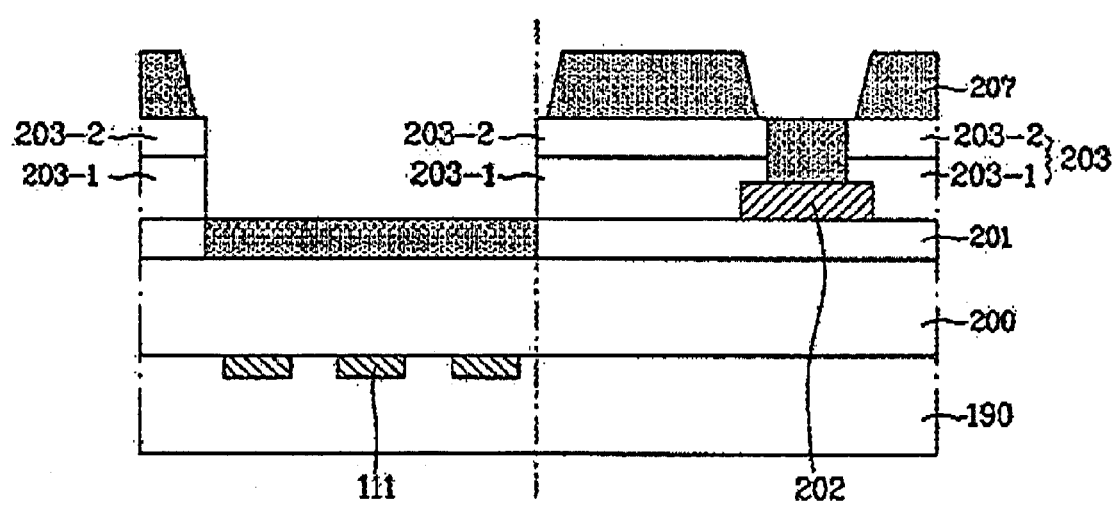

Referring to FIG. 4D, the patterned photoresist pattern 204 is removed. Then, high-density plasma chemical vapor deposition is used to form a high-density plasma oxide layer 207 over the substrate including the pad opening 205 and the deepened trench. The high-density plasma (HDP) oxide layer 207 may have a slope, for example of from 60° to 85°, that can be used in subsequent formation of a microlens layer The slope can be controlled by or correlated to the high-density plasma oxide layer's thickness, considering the desired etching slope. By performing the high-density plasma chemical vapor deposition as above, a protruding edge of an insulating layer (e.g., layer 203) is effectively etched by causing ions or other reactive species to collide vertically (or substantially vertically) with a structure including the insulating layer and metal lines under and/or adjacent to the insulating layer, and a deposition of the HDP insulating layer is induced in a high-aspect-ratio gap existing between the metal lines as a result of a high degree of integration of a semiconductor device.

Figure 4E:
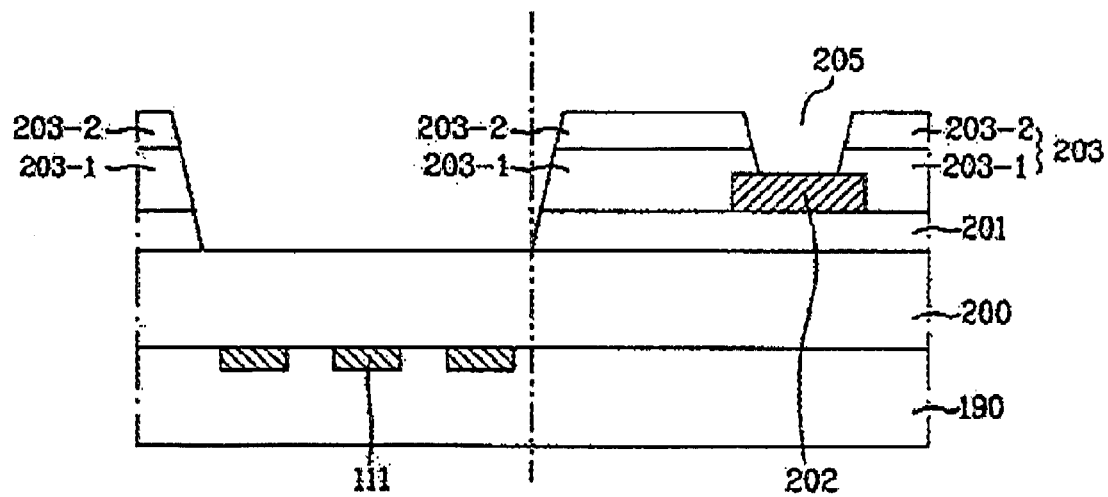

Referring to FIG. 4E, a subsequent removal of the high-density plasma oxide layer 207 generally results in an adjustment of the slope of a boundary structure between the photodiode and pad regions. The boundary structure comprises the second insulating interlayer 203 and the oxide layer 201, and generally has lateral sides of which one is in the pad region and the other is in (or proximate to) the photodiode region. A slope may thus be formed on lateral sides of the second insulating layer 203 and the oxide layer 201 in the trench 206, by the substantial removal of the high-density plasma oxide layer 207.

Figure 4F:
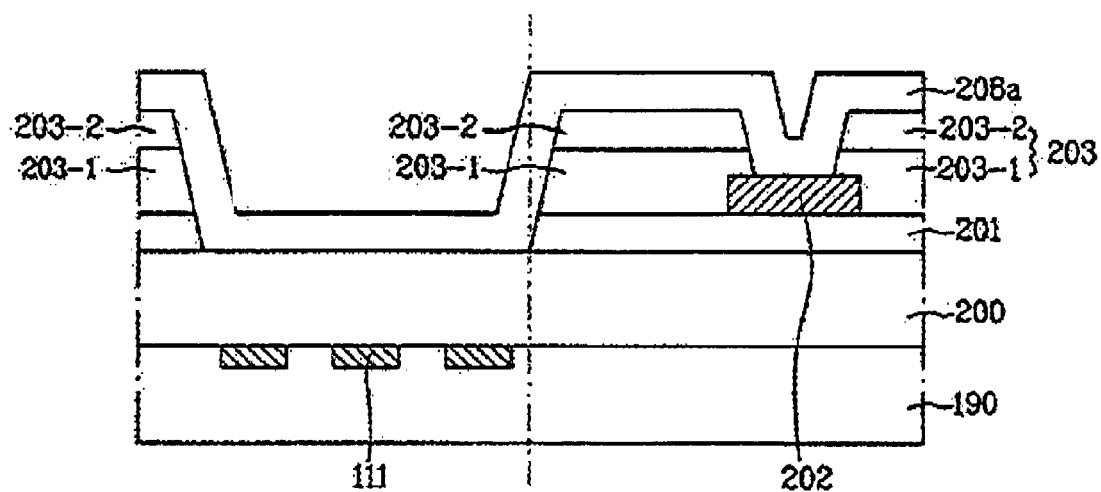

Referring to FIG. 4F, the substrate is coated with a microlens material layer 208a, which may comprise a resist or an oxide layer such as tetra-ethyl-ortho-silicate.

Figure 4G:
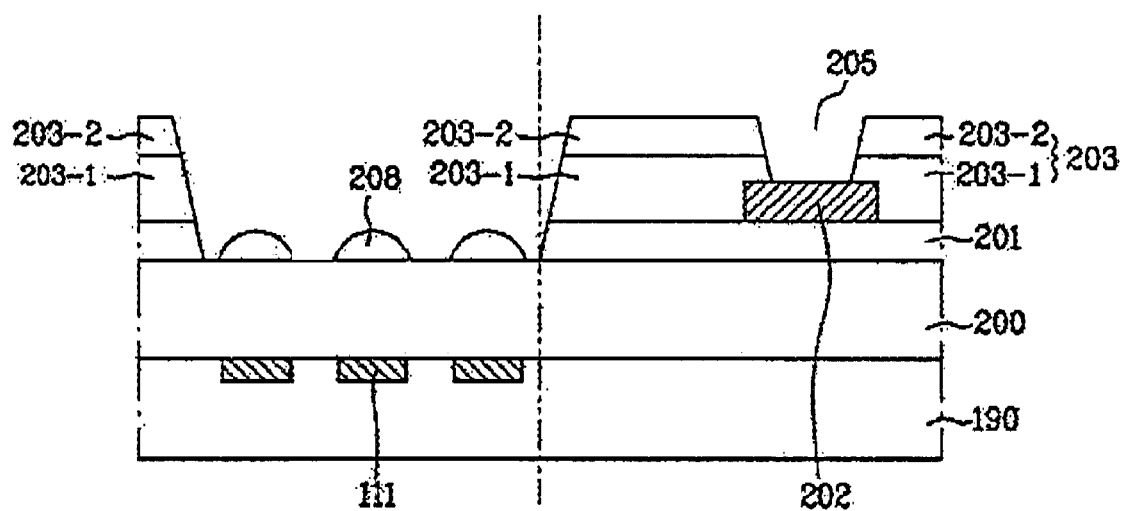

Referring to FIG. 4G, the microlens material layer 208a is selectively patterned to form a microlens pattern or a plurality of microlens bodies, and a reflowing process is carried out on the microlens pattern to form a plurality of microlenses 208. The reflowing process can be carried out using a hot plate or furnace. The curvature (radius) of the microlenses 208, which determines focusing efficiency, varies according to heating and contraction operation(s), and the microlenses are hardened by applying ultraviolet radiation or irradiating the microlenses with ultraviolet radiation to maintain their optimal curvature.

According to the present invention, the process is simplified by opening the pad region, and simultaneously, using the pad opening mask to remove the insulating layer in the photodiode region. Optical efficiency can be enhanced by shortening the path of incident light from a microlens to the corresponding photodiode. In addition, the uniformity of the microlens thickness can be enhanced by forming a slope in a second insulator layer (enabled by forming and then removing a high-density plasma oxide layer), so that striation(s) can be reduced or prevented from occurring in coating the microlens material layer on the substrate.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A method of fabricating a CMOS image sensor, comprising;
    forming, in a semiconductor substrate divided into a photodiode region and a pad region, a plurality of photodiodes in the photodiode region;
    fanning a first insulating layer over the semiconductor substrate including the photodiodes;
    forming a metal pad on the first insulating layer in the pad region;
    forming a second insulating layer over the semiconductor substrate including the metal pad;
    forming a mask layer on the second insulating layer, to expose portions of the second insulating layer over the metal pad and the photodiodes, respectively;
    etching the exposed portions of the second insulating layer to form simultaneously a pad opening in the pad region and a trench in the photodiode region;
    selectively etching portions of the second insulating layer and the first insulating layer under the trench with an etchant under conditions providing an etch selectivity ratio with respect to the metal pad; and
    forming a slope on lateral sides of at least the second insulating layer, wherein forming the slope comprises forming a high-density plasma oxide layer over the semiconductor substrate including the pad opening in the pad region and the trench in the photodiode region, and then removing the high-density plasma oxide layer.

2. The method of claim 1, further comprising: forming a plurality of microlenses on the first insulating layer in the photodiode region.

3. The method of claim 2, further comprising: hardening the microlenses using ultraviolet radiation.

4. The method of claim 1, wherein the second insulating layer comprises an oxide layer and a nitride layer thereon.

5. A method of fabricating a CMOS image sensor, comprising:
    etching exposed portions of an upper insulating layer to form simultaneously a pad opening in a pad region of the sensor and a trench in a photodiode region of the sensor, the sensor further comprising a lower insulating layer under the upper insulating layer, a metal pad in the pad region under the upper insulating layer and on the lower insulating layer, and a semiconductor substrate having a plurality of photodiodes in the photodiode region;
    selectively etching a remaining portion of the upper insulating layer and a portion of the lower insulating layer under the trench with an etchant under conditions providing an etch selectivity ratio with respect to the metal pad; and
    depositing a high-density plasma oxide layer over the upper insulating layer, including in the pad opening and the trench, and then removing the high-density plasma oxide layer, to form a slope on lateral sides of at least the upper insulating layer.

6. The method of claim 5, wherein the lower insulating layer comprises a first insulating interlayer and an oxide layer.

7. The method of claim 5, further comprising forming a mask on the upper insulating layer, exposing a first portion of the upper insulating layer over the metal pad and one or more second portions of the upper insulating layer over the photodiodes, respectively.

8. The method of claim 5, further comprising forming a plurality of microlenses on the lower insulating layer in the photodiode region.

9. The method of claim 5, wherein the etch selectivity ratio with respect to the metal pad of is at least 5:1.

10. The method of claim 5, wherein the upper insulating layer comprises an oxide layer and a nitride layer thereon.

11. The method of claim 1, wherein the etch selectivity ratio is of the first and second insulating layers to the metal pad.

12. The method of claim 5, wherein the etch selectivity ratio is of the upper and lower insulating layers to the metal pad.

13. The method of claim 1, wherein the etch selectivity ratio is at least 10:1.

14. The method of claim 13, wherein the etch selectivity ratio is at least 20:1.

15. The method of claim 5, wherein the etch selectivity ratio is at least 10:1.

16. The method of claim 15, wherein the etch selectivity ratio is at least 20:1.

17. The method of claim 1, wherein said selectively etching exposes an insulating interlayer in the photodiode region of the semiconductor substrate.

18. The method of claim 17, comprising depositing the high-density plasma oxide onto sidewalls of the first and second insulating layers and the exposed insulating interlayer.

19. The method of claim 5, wherein said selectively etching exposes an insulating interlayer in the photodiode region of the semiconductor substrate.

20. The method of claim 19, comprising depositing the high-density plasma oxide onto sidewalls of the upper and lower insulating layers and the exposed insulating interlayer.

* * * * *